United States Patent [19]
Micheloni et al.

[11] Patent Number: 6,157,225
[45] Date of Patent: Dec. 5, 2000

[54] DRIVING CIRCUIT WITH THREE OUTPUT LEVELS, ONE OUTPUT LEVEL BEING A BOOSTED LEVEL

[75] Inventors: Rino Micheloni, Turate; Giovanni Campardo, Bergamo; Marco Maccarrone, Palestro; Maurizio Branchetti, San Polo D'enza, all of Italy

[73] Assignee: STMicroelectronics S.r.l., Agrate Brianza, Italy

[21] Appl. No.: 09/234,016

[22] Filed: Jan. 19, 1999

[30] Foreign Application Priority Data

Jan. 23, 1998 [IT] Italy .................................. MI98A0115

[51] Int. Cl.[7] ........................ H03K 17/10; H03K 19/0185
[52] U.S. Cl. ........................ 327/112; 327/333; 327/541; 365/185.23; 326/88
[58] Field of Search ..................................... 327/112, 306, 327/333, 390, 537, 541, 543, 589, 330; 365/185.23, 189.09; 326/68, 80, 81, 88

[56] References Cited

U.S. PATENT DOCUMENTS

| | | |
|---|---|---|
| 4,697,101 | 9/1987 | Iwahashi et al. .......................... 326/88 |
| 5,412,604 | 5/1995 | Fukuda et al. ...................... 365/189.11 |
| 5,760,621 | 6/1998 | Keeth ....................................... 327/333 |
| 5,952,851 | 9/1999 | Yuen .......................................... 326/88 |

*Primary Examiner*—Timothy P. Callahan
*Assistant Examiner*—Terry L. Englund
*Attorney, Agent, or Firm*—Theodore E. Galanthay; Allen, Dyer, Doppelt, Milbrath & Gilchrist, P.A.

[57] ABSTRACT

A driving circuit supplied by a supply voltage and a reference voltage, generates an output signal and comprises a first circuit adapted to selectively couple the output signal to the reference voltage or to an internal voltage line internal to the driving circuit in response to a first control signal. The driving circuit also includes a switching circuit adapted to selectively couple the internal voltage line to the supply voltage. A boosting circuit is connected to the internal voltage line and is adapted to bring the internal voltage line to a boosted voltage. The switching circuit and the boosting circuit are controlled by a second control signal to be alternatively activatable, in such a way to bring the internal voltage line either to the supply voltage or to the boosted voltage.

26 Claims, 3 Drawing Sheets

1

DRIVING CIRCUIT WITH THREE OUTPUT LEVELS, ONE OUTPUT LEVEL BEING A BOOSTED LEVEL

FIELD OF THE INVENTION

The present invention relates to an electronic driving circuit, and, more particularly, to such a driving circuit having three output levels, one output level being a boosted level compared to the supply voltage.

SUMMARY OF THE INVENTION

In some integrated circuits there is a need to selectively couple a line carrying a boosted voltage higher than the supply voltage, to one or more lines downstream. For example, in the field of non-volatile memories there is the trend towards making devices capable of operating with lower and lower supply voltages. This can make it necessary to generate internally to the integrated circuit, boosted voltages compared to the supply voltage. The boosted voltages, in prescribed operating conditions of the devices such as the read mode, are supplied to the memory cells for a correct or, in any case, faster sensing thereof.

By way of example, in the case of Flash EEPROM memories, it is necessary to consider that the erased memory cells have a statistical (gaussian) distribution of the threshold voltage values, typically ranging from 0.5 to 2.5 V. The lower limit of 0.5 V stems from the necessity of assuring that no memory cells with negative threshold voltage exist (depleted cells) and at the same time that the thin gate oxide of the memory cells is not damaged during the programming phase. The upper limit of 2.5 V is due to the intrinsic width of the statistical distribution.

If such a memory is designed to work with supply voltages as low as 2.5 V, when the erased memory cells with threshold voltage close to 2.5 V are to be read by conventionally carrying the supply voltage to the gate electrode thereof, these cells will not conduct a sufficient current to allow the sense amplifier to unequivocally set the programming state. Accordingly, there is the risk that the erased memory cells appear as written.

To overcome this problem, a boost circuit is conventionally provided to supply the gate electrode of the cell to be read with a voltage higher than the supply voltage. Referring, for example, to FIG. 1, a Flash EEPROM memory is shown comprising two memory sectors S1 and S2 independently programmable and erasable. To each memory sector there is associated a respective row decoder RDEC1 and RDEC2, adapted to select the rows of memory cells of the two sectors S1 and S2 bringing the potential of the selected rows to the voltage level of their respective supply terminal N1 and N2.

Nodes N1 and N2 can be selectively coupled, through respective switches I1 and I2, to a voltage line $V_{PCX}$. In the read mode, the voltage line is kept to the supply voltage of the integrated circuit. When the memory cells of a sector have to be programmed the voltage line is brought to a higher voltage level (typically 10 V). This can either be supplied externally of the integrated circuit or can be generated internally in the integrated circuit by a charge pump.

A boosting circuit BOOST generates a boosted voltage $V_{BOOST}$ having a value higher than the supply voltage of the integrated circuit. Voltage $V_{BOOST}$ is selectively applied to nodes N1 and N2 through respective transfer transistors ("pass transistors") P1 and P2, controlled by respective control signals CNT1 and CNT2.

Assuming that it is desired to access sector S1 in the read mode, switch I1 is kept open while pass transistor P1 is turned on to transfer onto node N1 the boosted voltage $V_{BOOST}$. In this way the voltage of the selected row of sector S1 is brought to voltage $V_{BOOST}$ by row decoder RDEC1. At the same time, pass transistor P2 must be kept off to prevent transfer of voltage $V_{BOOST}$ onto node N2. This is necessary to prevent the output of the boost circuit BOOST from being excessively loaded by parasitic capacitances and paths. The excessive loading would cause a significant reduction of the value of $V_{BOOST}$. To prevent node N2 from being left floating, switch I2 is closed, and node N2 is brought to the supply voltage.

Turning on transistor P1 is assured by a potential on the gate electrode thereof (signal CNT1) equal to 0 V (reference voltage of the integrated circuit). To make pass transistor P2 prevent the transfer of voltage $V_{BOOST}$ on its source electrode to node N2, it is necessary that on the gate electrode thereof (signal CNT2) a potential equal to $V_{BOOST}$ be applied. A voltage value solely equal to the supply voltage could not be sufficient to assure that transistor P2 is off.

In the program mode, when voltage $V_{PCX}$ takes the value of 10 V, switches I1 and I2 are closed, and it is necessary to isolate nodes N1 and N2 from the boosting circuit BOOST. To assure that transistors P1 and P2 are actually off it is, however, necessary that the control signals thereof CNT1 and CNT2 take a potential equal to $V_{PCX}$, i.e., 10 V.

It is therefore necessary to drive transistors P1 and P2 by control signals CNT1 and CNT2 assuming three different voltage levels, respectively 0 V, $V_{BOOST}$ and $V_{PCX}$ (10 V). A similar driving can be necessary also in other applications, for example, whenever it is desired to carry to a same node boosted voltages coming from different boosting circuits.

SUMMARY OF THE INVENTION

In view of the state of the art described, it is an object of the present invention to provide a driving circuit with three output levels, one of which is a boosted level.

According to the present invention, such an object is achieved by a driving circuit supplied by a supply voltage and a reference voltage (ground of the integrated circuit), and generating an output signal. The circuit comprises first circuit means adapted to selectively couple the output signal to the reference voltage or to an internal voltage line internal to the integrated circuit in response to a first control signal. The circuit also includes switching means adapted to selectively couple the internal voltage line to the supply voltage, and a boosting circuit connected to the internal voltage line and adapted to bring the internal voltage line to a boosted voltage. The switching means and the boosting circuit are controlled by a second control signal to be alternatively activatable, to bring the internal voltage line either to the supply voltage or to the boosted voltage.

BRIEF DESCRIPTION OF THE DRAWINGS

The features and advantages of the present invention will be made apparent by the following detailed description of two practical embodiments thereof, illustrated by way of examples only in the annexed drawings, wherein.

DETAILED DESCRIPTION OF THE PREFERRED EMBODIMENTS

Figure 1:
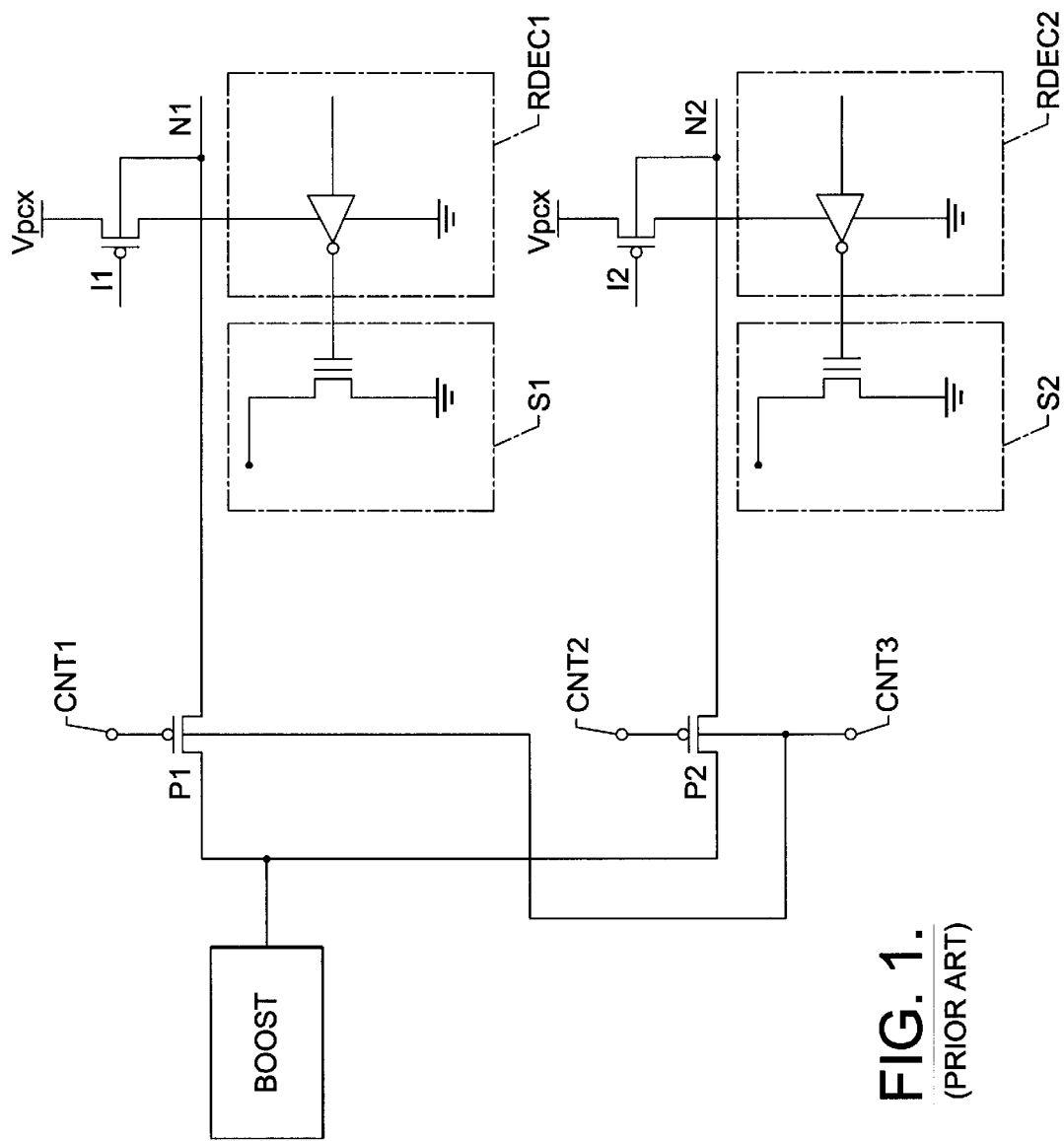
FIG. 1 schematically shows a memory device in which the driving circuit according to the present invention can be used.

FIG. 1 schematically shows a memory device in which the driving circuit of the present invention can be used. The memory device comprises two memory sectors S1 and S2 with associated two row decoders RDEC1 and RDEC2 supplied by supply nodes N1 and N2. Nodes N1 and N2 can be selectively coupled, by respective switches I1 and I2, to a voltage line $V_{PCX}$. When necessary the nodes can be selectively coupled to a boosting circuit BOOST by respective transistors P1 and P2, controlled by respective control signals CNT1 and CNT2. The bulk or body electrodes of transistors P1 and P2 are connected together and driven by a control signal CNT3, to always have the highest voltage value present in the entire circuit. Control signals CNT1, CNT2 and CNT3 can take three different voltage values, one of which is a boosted value. The control signals are each generated by a respective driving circuit according to the present invention.

Figure 2:
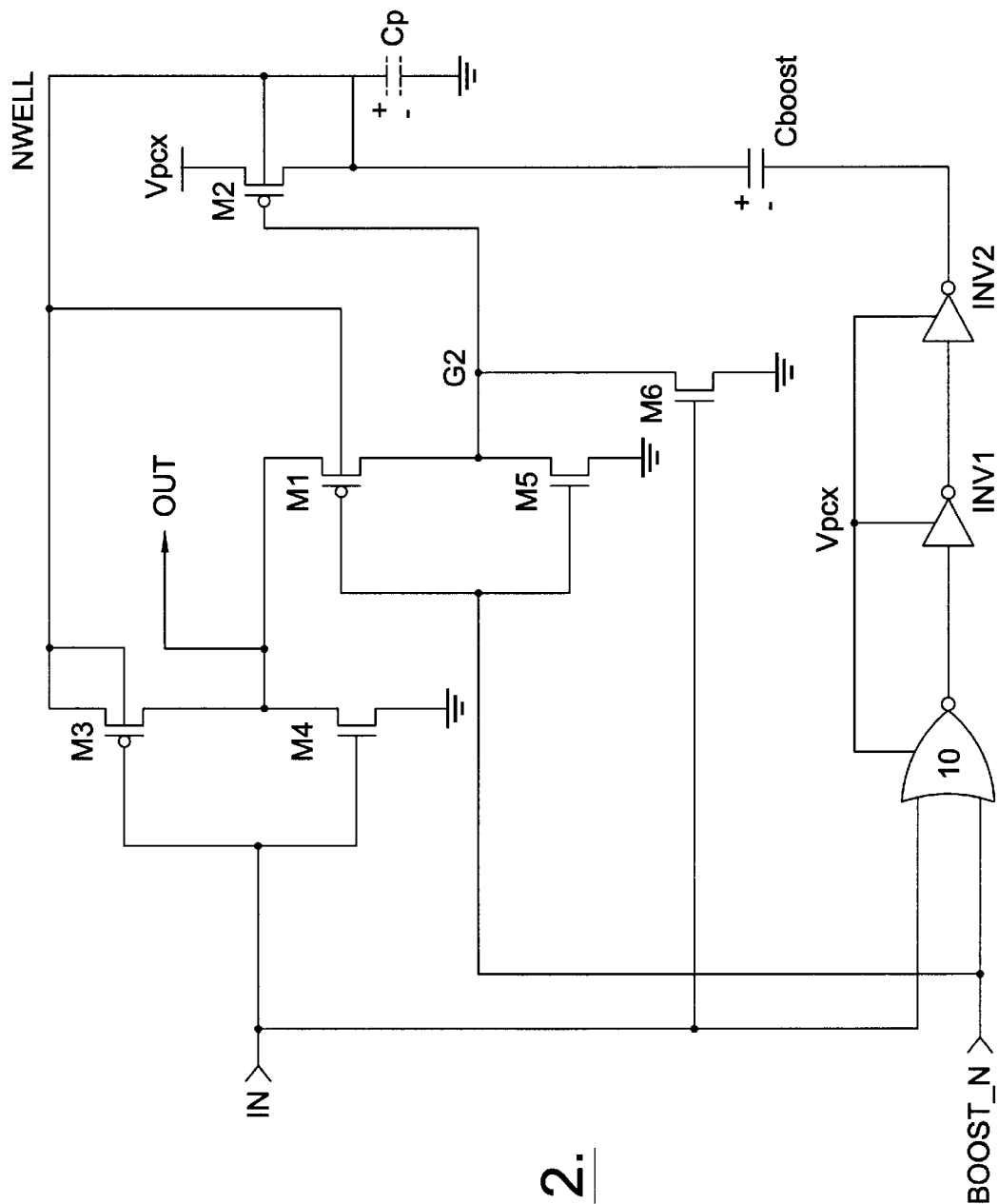
FIG. 2 is a circuit diagram of a driving circuit according to a first embodiment of the present invention.

FIG. 2 is a circuit diagram of a driving circuit according to a first embodiment of the present invention. At the input of the circuit two logic control signals IN and BOOST_N are shown, while the output is taken from node OUT. Logic signal IN is connected to the gate electrodes of two MOSFETs M3 and M4, respectively P-channel and N-channel, connected in series between a node NWELL and ground so as to form a first circuit having structure similar to that of a CMOS inverter. The output of this circuit, other than forming the output node OUT of the circuit, also acts as a supply line for a second circuit similar to the first circuit, formed by two MOSFETs M1 and M5, respectively P-channel and N-channel, connected in series with each other. The gate electrodes of MOSFETs M1 and M5 are driven by signal BOOST_N. The output of the second circuit, indicated as G2, drives the gate electrode of a P-channel MOSFET M2 which on its source electrode receives a supply voltage $V_{PCX}$ and whose drain electrode is connected to node NWELL.

To the drain electrode of M2 there is further connected a first terminal of a boosting capacitor $C_{BOOST}$. The boosting capacitor has a second terminal connected to the output of a chain formed by a NOR logic gate, indicated as 10, receiving at the input the two signals IN and BOOST_N, and two cascaded inverters INV1 and INV2 connected to the output of NOR gate 10. Signal IN additionally controls an N-channel MOSFET M6 at its gate, the N-channel MOSFET having a drain electrode connected to node G2 and a source electrode connected to ground.

Since the bulk electrode of a P-channel MOSFET must always be the terminal at the highest potential, the bulk electrode of P-channel MOSFETs M1, M2 and M3 is connected to node NWELL. The node NWELL, as will be shown, is always the node with the highest potential in the whole circuit. A capacitor Cp identifies a parasitic capacitance seen by node NWELL.

We now analyze in detail the operation of the circuit described. In the case signal BOOST_N is at the low logic level (ground), NOR gate 10 becomes responsive to logic signal IN. Transistor M1, which is ON, can transfer the voltage value at the output of the first inverter formed by transistors M3 and M4, to the gate electrode of transistor M2.

If logic signal IN is at the high logic level (having a value equal to $V_{PCX}$), the output of the first inverter formed by transistors M3 and M4 is at ground. Thus the output OUT of the circuit is also at ground. Logic signal IN at the high logic level turns transistor MG on, so the potential of the gate electrode of transistor M2 is kept at ground and transistor M2 is kept on.

By turning transistor M2 on, capacitor $C_{BOOST}$ is precharged to a voltage equal to $V_{PCX}$. The value of the voltage on the node corresponding to the lower terminal or plate of capacitor $C_{BOOST}$ is constantly determined by the output of the logic path formed by NOR gate 10 and the two cascaded inverters INV1 and INV2. Accordingly, it is controlled by signals IN and BOOST_N. In this situation logic signal BOOST_N is kept at the low logic level while logic signal IN is at the high logic level, so the output of the logic path is at the low logic level (ground).

When logic signal IN switches to the low logic level, the logic path formed by NOR gate 10 and the two inverters INV1 and INV2 provide at the output of the second inverter INV2 a high voltage value. For charge conservation capacitor $C_{BOOST}$ tries to keep the potential difference to which it was pre-charged. Accordingly, node NWELL reaches a boosted voltage value equal to $V_{BOOST}=2*V_{PCX}$ (boosted condition), a theoretical value which is reached in absence of parasitic capacitances Cp on node NWELL. If parasitic capacitances Cp exist, then $V_{BOOST}=V_{PCX}+V_{PCX}*C_{BOOST}/(C_{BOOST}+CP)$ will result. Such a value is also present on the output node OUT because the input logic signal IN at the low level turns transistor M4 off and turns transistor M3 on. This allows the transfer of the voltage value $V_{BOOST}$ from node NWELL to the output node OUT. Such a voltage value is transferred, through transistor M1 that is on, to the gate electrode of transistor M2, the latter being turned off. Also transistor MG is off, having the gate electrode at ground.

In the case logic control signal BOOST_N is at the high logic level, the output node of inverter INV2 is low (at ground) irrespective of the value of signal IN, and in this way boosting is prevented. Transistor M1 turns off while transistor M5 turns on and this assures that P-channel MOSFET M2 is on, since the gate electrode thereof is at ground. Turning on of transistor M2 provides for charging capacitor $C_{BOOST}$, since voltage $V_{PCX}$ present at the source electrode is transferred to the drain electrode, and node NWELL is thus at a voltage equal to $V_{PCX}$. Now logic control signal IN determines, by the inverter formed by transistors M3 and M4, if the output OUT is at ground (IN high) or have a value equal to $V_{PCX}$ (IN low).

It should be observed that transistor M6 is necessary to pre-charge capacitor $C_{BOOST}$ when control signal BOOST_N is at the low logic level, since to turn transistor M2 on the gate electrode thereof, corresponding to node G2, must be brought to ground. This function is performed by transistor M6 because transistor M1 is not able to do so, being a P-channel MOSFET. Transistor M6 can also be excluded in the case capacitor $C_{BOOST}$ is pre-charged keeping the logic control signal BOOST_N at the high logic level. In this case it is sufficient to turn transistor M5 on so to bring node G2 to ground and thus turn transistor M2 on.

Figure 3:
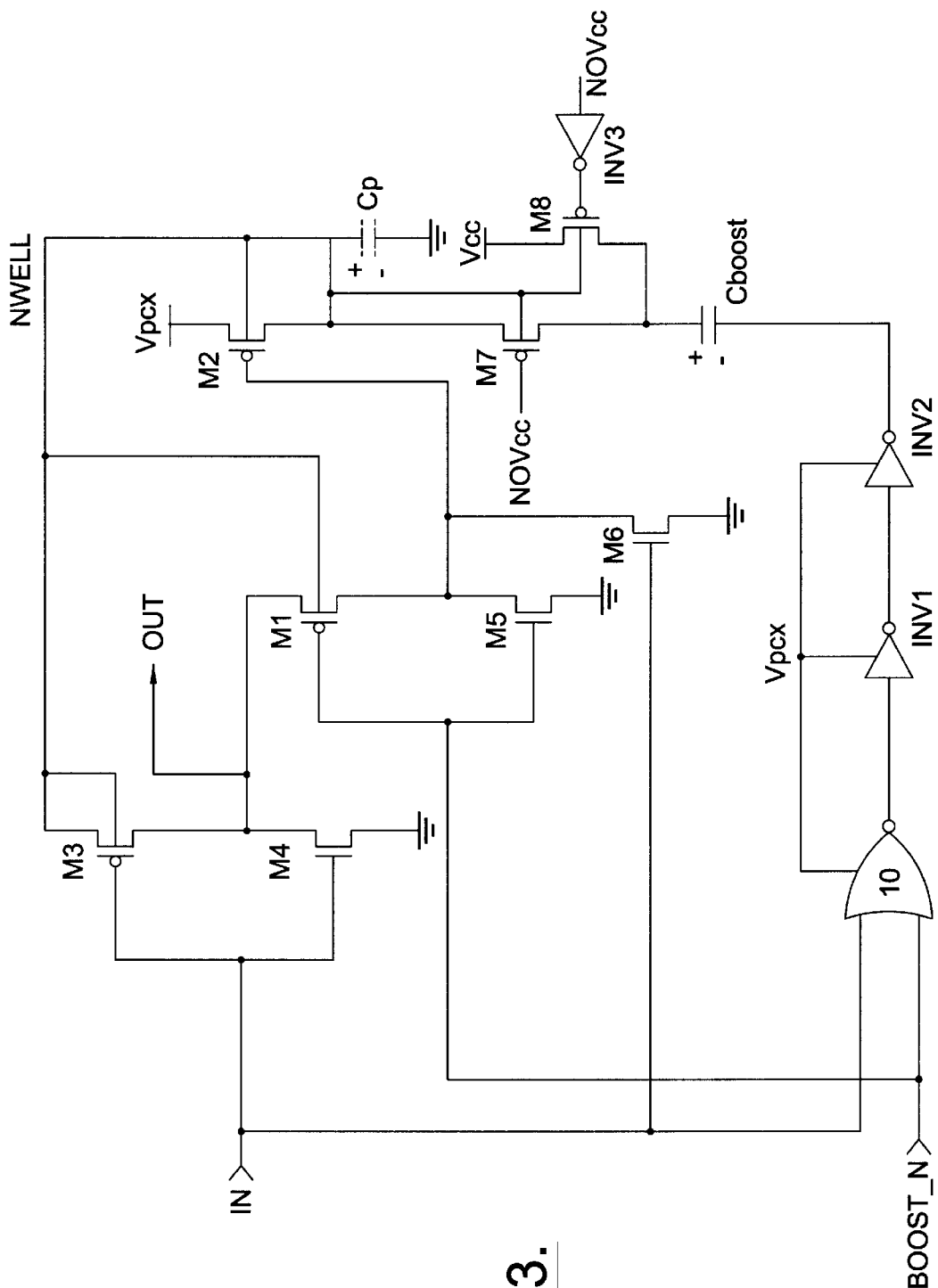
FIG. 3 is a circuit diagram of a second embodiment of the present invention.

FIG. 3 is a circuit diagram of a second embodiment of the present invention: compared to the previous diagram, two P-channel MOSFETs M7 and M8 have been added, as well as an inverter INV3 and a new logic control signal $NOV_{cc}$. Transistor M7 is driven by signal $NOV_{cc}$ on the gate electrode thereof. Transistor M7 has the source electrode connected to node NWELL and the drain electrode connected to the upper plate of capacitor $C_{BOOST}$. Transistor M8 has the gate electrode connected to the output of inverter INV3, in turn driven by signal $NOV_{cc}$. Transistor M8 has the source electrode kept at a fixed supply voltage $V_{cc}$ (e.g., 2.5 V) and the drain electrode connected to the upper plate of capacitor $C_{BOOST}$. The bulk or body electrodes of transistors M7 and M8 are connected to the highest potential in the circuit, i.e. node NWELL.

The operation of the circuit is the same as above, the only difference being the possibility of uncoupling capacitor $C_{BOOST}$ from node NWELL and thus from the supply voltage $V_{PCX}$. The necessity of isolating capacitor $C_{BOOST}$ from the supply voltage $V_{PCX}$ stems from the desire for not loading voltage $V_{PCX}$ when it is not strictly necessary. This is so because in some applications such a voltage could be generated by charge pumps which, as known, have a limited capability of supplying current. For example, in the design and fabrication of non-volatile memories, the current trend is one of providing devices operating with a single supply voltage. The voltages necessary for programming, erasing or reading the memory cells do not come from external supplies, but are instead generated internally to the device by charge pumps.

For example, for programming, a multi-stage charge pump is used which, starting from a voltage value of 2.5 V, is able to provide a voltage level of approximately 10 V. This is suitable for properly biasing the gate electrode of the memory cell. In this case the value of voltage $V_{PCX}$ is equal to $V_{cc}$ (2.5 V) in the read mode, and 10 V in the programming mode. Since supply node $V_{PCX}$ is charged by a charge pump, the less capacitance connected to this node the faster the charging is. Moreover, by isolating capacitor $C_{BOOST}$ from node $V_{PCX}$ during programming when the value of $V_{PCX}$ is higher than that of the supply voltage $V_{cc}$, a thin oxide can be used as a dielectric for capacitor $C_{BOOST}$. In addition, the thinner oxide used in the manufacturing process saves silicon area.

To uncouple capacitor $C_{BOOST}$ from supply node $V_{PCX}$, the logic control signal $NOV_{cc}$ switches from the low logic level to the high logic level (equal to $V_{PCX}$). Consequently transistor M7 turns off. Simultaneously, transistor M8 is turned on since the gate electrode thereof is at ground, and keeps capacitor $C_{BOOST}$ charged to the potential difference $V_{cc}$, preventing the upper plate from being left floating.

That which is claimed is:

1. A driving circuit supplied by a supply voltage and a reference voltage, and generating an output signal, the driving circuit comprising:
   an internal voltage line;
   a first circuit for selectively coupling the output signal to one of the reference voltage or to the internal voltage line in response to a first control signal;
   a first switching circuit for selectively coupling the internal voltage line to the supply voltage; and
   a boosting circuit connected to the internal voltage line for bringing the internal voltage line to a boosted voltage;
   said first switching circuit and said boosting circuit being controlled by a second control signal for being alternatively activatable to bring the internal voltage line to one of the supply voltage or to the boosted voltage.

2. A driving circuit according to claim 1, wherein said boosting circuit comprises:
   a control circuit receiving the second control signal; and
   a boosting capacitor having a first terminal driven by the control circuit to bring the first terminal from the reference voltage to the supply voltage, the boosting capacitor having a second terminal connected to the internal voltage line;
   said first switching circuit charging said boosting capacitor.

3. A driving circuit according to claim 2, further comprising a second circuit for controlling the first switching circuit, the second circuit being driven by the second control signal for inhibiting the first switching circuit when the boosting circuit is activated.

4. A driving circuit according to claim 3, wherein said first circuit comprises a first switch and a second switch connected in series between the internal voltage line and the reference voltage; wherein the first switch and the second switch are controlled by the first control signal and having a common node generating the output signal; wherein the first switch is activatable for connecting the output signal to the internal voltage line; and wherein the second switch is activatable in alternative to the first switch for connecting the output signal to the reference voltage.

5. A driving circuit according to claim 4, wherein said first switch comprises a first P-channel MOSFET; wherein said second switch comprises a first N-channel MOSFET; and wherein a bulk electrode of said first P-channel MOSFET is connected to the internal voltage line.

6. A driving circuit according to claim 5, wherein said second circuit comprises a third switch and a fourth switch connected in series between the output signal and the reference voltage; wherein the third switch and the fourth switch are controlled by the second control signal and have a common node providing a driving signal for the first switching circuit; wherein the third switch is activatable for connecting the output signal to the driving signal for the first switching circuit; and wherein the fourth switch is activatable as an alternative to the third switch to connect the driving signal for the first switching circuit to the reference voltage.

7. A driving circuit according to claim 6, wherein said third switch comprises a second P-channel MOSFET having a bulk electrode connected to the internal voltage line; and wherein said fourth switch comprises a second N-channel MOSFET.

8. A driving circuit according to claim 7, wherein said first switching circuit comprises a third P-channel MOSFET having a bulk electrode connected to the internal voltage line.

9. A driving circuit according to claim 1, further comprising a second switching circuit driven by the first control signal; and wherein said second switching circuit drives said first switching circuit.

10. A driving circuit according to claim 7, further comprising a third N-channel MOSFET driven by the first control signal and having a source connected to the reference voltage and a drain electrode connected to the driving signal for the first switching circuit.

11. A driving circuit according to claim 9, further comprising a third switching circuit controlled by a third control signal for uncoupling said boosting circuit from the internal voltage line and coupling the boosting capacitor in alternative to a second supply voltage.

12. A driving circuit according to claim 11, wherein said third switching circuit comprises a first P-channel MOSFET and a second P-channel MOSFET connected to each other by respective drains, and having bulk electrodes connected to the internal voltage line; and wherein the first P-channel MOSFET and the second P-channel MOSFET being respectively controlled by the third control signal and by a logic complement thereof.

13. A driving circuit supplied by a supply voltage and a reference voltage, and generating an output signal, the driving circuit comprising:
   a first circuit for selectively coupling the output signal to one of the reference voltage or to an internal voltage line internal to the driving circuit in response to a first control signal;

a first switching circuit for selectively coupling the internal voltage line to the supply voltage; and a boosting circuit connected to the internal voltage line for bringing the internal voltage line to a boosted voltage, said boosting circuit comprising a control circuit receiving a second control signal, and a boosting capacitor having a first terminal driven by the control circuit to bring the first terminal from the reference voltage to the supply voltage, the boosting capacitor having a second terminal connected to the internal voltage line;

said first switching circuit and said boosting circuit being controlled by the second control signal for being alternatively activatable to bring the internal voltage line to one of the supply voltage or to the boosted voltage.

14. A driving circuit according to claim 13, further comprising a second circuit for controlling the first switching circuit, the second circuit being driven by the second control signal for inhibiting the first switching circuit when the boosting circuit is activated.

15. A driving circuit according to claim 14, wherein said first circuit comprises a first switch and a second switch connected in series between the internal voltage line and the reference voltage; wherein the first switch and the second switch are controlled by the first control signal and having a common node generating the output signal; wherein the first switch is activatable for connecting the output signal to the internal voltage line; and wherein the second switch is activatable in alternative to the first switch for connecting the output signal to the reference voltage.

16. A driving circuit according to claim 15, wherein said first switch comprises a first P-channel MOSFET; wherein said second switch comprises a first N-channel MOSFET; and wherein a bulk electrode of said first P-channel MOSFET is connected to the internal voltage line.

17. A driving circuit according to claim 6, wherein said second circuit comprises a third switch and a fourth switch connected in series between the output signal and the reference voltage; wherein the third switch and the fourth switch are controlled by the second control signal and have a common node providing a driving signal for the first switching circuit; wherein the third switch is activatable for connecting the output signal to the driving signal for the first switching circuit; and wherein the fourth switch is activatable as an alternative to the third switch to connect the driving signal for the first switching circuit to the reference voltage.

18. A driving circuit according to claim 17, wherein said third switch comprises a second P-channel MOSFET having a bulk electrode connected to the internal voltage line; and wherein said fourth switch comprises a second N-channel MOSFET.

19. A driving circuit according to claim 18, wherein said first switching circuit comprises a third P-channel MOSFET having a bulk electrode connected to the internal voltage line.

20. A driving circuit according to claim 13, further comprising a second switching circuit driven by the first control signal; and wherein said second switching circuit drives said first switching circuit.

21. A driving circuit according to claim 18, further comprising a third N-channel MOSFET driven by the first control signal and having a source connected to the reference voltage and a drain electrode connected to the driving signal for the first switching circuit.

22. A driving circuit according to claim 20, further comprising a third switching circuit controlled by a third control signal for uncoupling said boosting circuit from the internal voltage line and coupling the boosting capacitor in alternative to a second supply voltage.

23. A driving circuit according to claim 22, wherein said third switching circuit comprises a first P-channel MOSFET and a second P-channel MOSFET connected to each other by respective drains, and having bulk electrodes connected to the internal voltage line; and wherein the first P-channel MOSFET and the second P-channel MOSFET being respectively controlled by the third control signal and by a logic complement thereof.

24. A method for driving a memory circuit using a driving circuit supplied by a supply voltage and a reference voltage, and generating an output signal, the method comprising the steps of:

selectively coupling the output signal to one of the reference voltage or to an internal voltage line internal to the driving circuit in response to a first control signal and using a first circuit;

selectively coupling the internal voltage line to the supply voltage using a first switching circuit;

boosting the internal voltage line to a boosted voltage using a boosting circuit; and controlling the first switching circuit and the boosting circuit by the first control signal and a second control signal to be alternatively activatable to bring the internal voltage line to one of the supply voltage or to the boosted voltage.

25. A method according to claim 24, wherein the step of boosting comprises the steps of:

driving a first terminal of a boosting capacitor by a control circuit receiving the second control signal to bring the first terminal from the reference voltage to the supply voltage; and using the first switching circuit for pre-charging the boosting capacitor.

26. A method according to claim 25, further comprising the step of controlling the first switching circuit using a second circuit driven by the second control signal for inhibiting the first switching circuit when the boosting circuit is activated.

* * * * *